United States Patent
Osawa et al.

(10) Patent No.: US 7,786,489 B2
(45) Date of Patent: Aug. 31, 2010

(54) NITRIDE SEMICONDUCTOR LIGHT EMITTING DEVICE AND PRODUCTION METHOD THEREOF

(75) Inventors: Hiroshi Osawa, Chiba (JP); Takashi Hodota, Ichihara (JP)

(73) Assignee: Showa Denko K.K., Tokyo (JP)

( * ) Notice: Subject to any disclaimer, the term of this patent is extended or adjusted under 35 U.S.C. 154(b) by 296 days.

(21) Appl. No.: 12/066,359

(22) PCT Filed: Sep. 7, 2006

(86) PCT No.: PCT/JP2006/318231

§ 371 (c)(1),
(2), (4) Date: Mar. 10, 2008

(87) PCT Pub. No.: WO2007/032421

PCT Pub. Date: Mar. 22, 2007

(65) Prior Publication Data

US 2009/0045433 A1    Feb. 19, 2009

Related U.S. Application Data

(60) Provisional application No. 60/718,738, filed on Sep. 21, 2005.

(30) Foreign Application Priority Data

| Sep. 13, 2005 | (JP) | 2005-265300 |
| Oct. 27, 2005 | (JP) | 2005-312819 |

(51) Int. Cl.
*H01L 33/00* (2010.01)

(52) U.S. Cl. ............... 257/79; 257/13; 257/80; 257/E51.018; 438/22; 438/701

(58) Field of Classification Search ............ 257/86, 257/31, 103; 438/22, 701
See application file for complete search history.

(56) References Cited

U.S. PATENT DOCUMENTS

| 6,677,173 B2 * | 1/2004 | Ota .................. 438/22 |
| 2005/0072983 A1 | 4/2005 | Chang et al. |
| 2006/0097277 A1 * | 5/2006 | Yoo .................. 257/99 |

FOREIGN PATENT DOCUMENTS

| JP | 11-293493 | 10/1999 |
| JP | 3511970 B2 | 10/2000 |
| JP | 2001-274507 A | 10/2001 |

(Continued)

*Primary Examiner*—Howard Weiss
*Assistant Examiner*—Steven H Rao
(74) *Attorney, Agent, or Firm*—Sughrue Mion, PLLC

(57) ABSTRACT

The present invention provides a nitride semiconductor light emitting device, which comprises positive and negative electrodes with high adhesion, can output high power, and does not generate heat; specifically, the present invention provides a nitride semiconductor light emitting device comprising at least an ohmic contact layer, a p-type nitride semiconductor layer, a nitride semiconductor light emitting layer, and an n-type nitride semiconductor layer, which are laminated on a plate layer, wherein a plate adhesion layer is formed between the ohmic contact layer and the plate layer, and the plate adhesion layer is made of an alloy comprising 50% by mass or greater of a same component as a main component of an alloy contained in the plate layer.

15 Claims, 4 Drawing Sheets

FOREIGN PATENT DOCUMENTS

| | | |
|---|---|---|
| JP | 2003-318443 A | 11/2003 |
| JP | 2004-47704 A | 2/2004 |
| JP | 2005-117015 A | 4/2005 |
| KR | 10-2005-0012729 A | 2/2005 |
| KR | 10-2005-0013989 A | 2/2005 |

* cited by examiner

NITRIDE SEMICONDUCTOR LIGHT EMITTING DEVICE AND PRODUCTION METHOD THEREOF

CROSS-REFERENCE TO RELATED APPLICATIONS

This application claims the benefit pursuant to 35 U.S.C. §119 (e) of U.S. Provisional Application No. 60/718,738 filed on Sep. 21, 2005, and priority is claimed on Japanese Patent Application No. 2005-265300, filed on Sep. 13, 2005, Japanese Patent Application No. 2005-312819, filed on Oct. 27, 2005, and U.S. Provisional Application No. 60/718,738 filed on Sep. 21, 2005, the contents of which are incorporated herein by reference.

TECHNICAL FIELD

The present invention relates to a nitride semiconductor light emitting device, and a production method thereof, and in particular, to a nitride semiconductor light emitting device comprising a plate layer which sufficiently supports a laminate after peeling a substrate and a production method thereof.

BACKGROUND ART

In recent years, GaN compound semiconductor material has received much attention as semiconductor material used for short wavelength light emitting devices. A GaN compound semiconductor is formed on an oxide substrate such as a sapphire single crystal substrate, or Group III-V compound substrates by a metalorganic chemical vapor deposition method (MOCVD method) or a molecular beam epitaxy method (MBE method).

A sapphire single crystal substrate has a lattice constant which differs from the lattice constant of GaN by 10% or more. However, since a nitride semiconductor having excellent properties can be formed by forming on a sapphire single crystal substrate a buffer layer comprising AlN or AlGaN, a sapphire single crystal substrate is widely used. For example, as is shown in FIG. 5, when a sapphire single crystal substrate 1 is used, an n-type GaN semiconductor layer 3, a GaN light emitting layer 4, and a p-type GaN semiconductor layer 5 are formed on the sapphire single crystal substrate 1 in this order. Since a sapphire single crystal substrate 1 is insolent, in general, in a device 20 comprising a sapphire single crystal substrate 1, both a negative electrode 12 formed on the n-type GaN semiconductor layer 3 and a positive electrode 13 formed on a p-type GaN semiconductor layer 5 are positioned on one side of the device 20, as is shown in FIGS. 4 and 5. Examples of a method for extracting light from a device 20 comprising the positive and negative electrodes on one side include a face-up method in which light is extracted from the p-semiconductor side using a transparent electrode such as ITO as a positive electrode, and a flip-chip method in which light is extracted from the sapphire substrate side using a high reflective film such as Ag as a positive electrode.

As is explained above, sapphire single crystal substrates are widely used. However, since sapphire is insolent, a sapphire single crystal substrate has some problems. First of all, in order to form the negative electrode 12, the n-type semiconductor 3 is exposed by etching the light emitting layer 4, as is shown in FIG. 5, therefore, the area of light emitting layer 4 is decreased by the area of the negative electrode 12, and output power decreases. Secondly, since the positive electrode 13 and the negative electrode 12 are positioned on the same side, electrical current flows horizontally, current density is increased locally, and the device 20 is heated. Thirdly, since heat conductivity of a sapphire substrate 1 is low, generated heat is not diffused, and the temperature of the device 20 increases.

In order to solve these problems, a method is used in which a conductive base plate is attached to a device comprising an n-type semiconductor layer, a light emitting layer, and a p-type semiconductor layer which are laminated on a sapphire single crystal substrate in this order, the sapphire single crystal substrate is removed, and then a positive electrode and a negative electrode are positioned on both surfaces of the resulting laminate (For example, Japanese Patent (Granted) Publication No 3511970).

In addition, the conductive base plate is formed by plating, not by attaching (For example, Japanese Unexamined Patent Application, First Publication 2001-274507).

Furthermore, when the conductive base plate is formed by plating, an intermediate layer is formed to improve adhesion between a p-type semiconductor and a plating layer, that is, a p-type semiconductor and a conductive base plate (For example, Japanese Unexamined Patent Application, First Publication 2004-47704).

DISCLOSURE OF INVENTION

Examples of a method for attaching a conductive base plate include a method in which metal compounds having a low melting point such as AuSn are used as an adhesive, and an activation junction method in which a surface to be joined is activated by argon plasma under vacuum. These methods require that the surface to be attached be extremely flat and smooth. Therefore, if there is foreign matter such as particles on the surface to be attached, the area is not closely attached. Due to this, it is difficult to obtain a uniform attached surface.

In the case of obtaining a conductive base plate on the p-type semiconductor layer by plating, the method suffers from few adverse effects from foreign matter. However, in order to make a film made by plating which operates as a conductive base plate, it has to have a thickness of 10 μm or greater, consequently problems may arise in adhering to the p-type conductive layer.

In general, in order to make contact closely between the conductive base plate and the p-type semiconductor layer, an ohmic contact layer for ohmic contacting is formed on the p-conductive layer, and the conductive base plate is formed on the ohmic contact layer by plating.

In Japanese Unexamined Patent Application, First Publication 2004-47704, adhesion is improved by forming an intermediate layer as a plating base film between the ohmic contact layer and the conductive base plate (the plate layer). In Japanese Unexamined Patent Application, First Publication 2004-47704, a device comprising an intermediate layer made of Au or AuGe which functions as a plating base film for a Ni plate is disclosed in the Examples. However, these plating base films for plating cannot yield sufficient adhesion.

As a result of conducting diligent research that focused on solving these problems, the present inventors found that a nitride semiconductor light emitting device, which has high adhesion between an ohmic contact layer and a plate layer and does not cause peeling, is obtained by a nitride semiconductor light emitting device comprising at least an n-type nitride semiconductor layer, a nitride semiconductor light emitting layer, a p-type nitride semiconductor layer, an ohmic contact layer, and a plate layer laminated in this order, wherein a plate adhesion layer is formed between the ohmic contact layer and the plate layer, and the plate adhesion layer is made of an alloy comprising 50% by mass or greater of a same component as a main component of an alloy contained in the plate layer. That is, the present invention provides the following nitride semiconductor light emitting devices and production methods thereof.

(1) A nitride semiconductor light emitting device comprising at least an ohmic contact layer, a p-type nitride semiconductor layer, a nitride semiconductor light emitting layer, and an n-type nitride semiconductor layer, which are laminated on a plate layer, wherein a plate adhesion layer is formed between the ohmic contact layer and the plate layer, and the plate adhesion layer is made of an alloy comprising 50% by mass or greater of a same component as a main component of an alloy contained in the plate layer.

(2) The nitride semiconductor light emitting device according to (1), wherein a thickness of the plate layer is in a range from 10 μm to 200 μm.

(3) The nitride semiconductor light emitting device according to (3), wherein the plate layer is made of a NiP alloy.

(4) The nitride semiconductor light emitting device according to (4), wherein the plate layer is made of Cu or a Cu alloy.

(5) The nitride semiconductor light emitting device according to (3), wherein the plate adhesion layer is made of a NiP alloy.

(6) The nitride semiconductor light emitting device according to (4), wherein the plate adhesion layer is made of Cu or a Cu alloy.

(7) The nitride semiconductor light emitting device according to (1) or (2), wherein a thickness of the plate adhesion layer is in a range from 0.1 nm to 2 μm.

(8) The nitride semiconductor light emitting device according to (1) or (2), wherein the ohmic contact layer is made of at least one selected from the group consisting of Pt, Ru, Os, Rh, Ir, Pd, Ag, and alloys thereof.

(9) The nitride semiconductor light emitting device according to (1) or (2), wherein a thickness of the ohmic contact layer is in a range from 0.1 nm to 30 nm.

(10) The nitride semiconductor light emitting device according to (1) or (2), wherein a reflective layer is made of Ag or a Ag alloy is formed on the ohmic contact layer.

(11) A method for producing a nitride semiconductor light emitting device comprising: laminating at least a buffer layer, an n-type nitride semiconductor layer, a nitride semiconductor light emitting layer, a p-type nitride semiconductor layer, an ohmic contact layer, a plate adhesion layer, and a plate layer on a substrate made of an oxide single crystal or a semiconductor single crystal in this order; then removing the substrate and the buffer layer; and then forming electrodes.

(12) The method for producing a nitride semiconductor light emitting device according to (11), wherein the plate adhesion layer is formed by a sputtering method.

(13) The method for producing a nitride semiconductor light emitting device according to (11) or (12), wherein the plate layer is formed by an electroless plating method.

(14) The method for producing a nitride semiconductor light emitting device according to (11) or (12), wherein the plate layer is formed by an electrolysis plating method.

(15) The method for producing a nitride semiconductor light emitting device according to (11) or (12), wherein after forming the plate layer, the obtained product is heated at a temperature in a range from 100° C. to 300° C.

BEST MODE FOR CARRYING OUT THE INVENTION

The embodiments of the present invention will be explained with references to the figures. However, the present invention is not limited to the following embodiments and, for example, may be a combination of the following embodiments.

Figure 1:
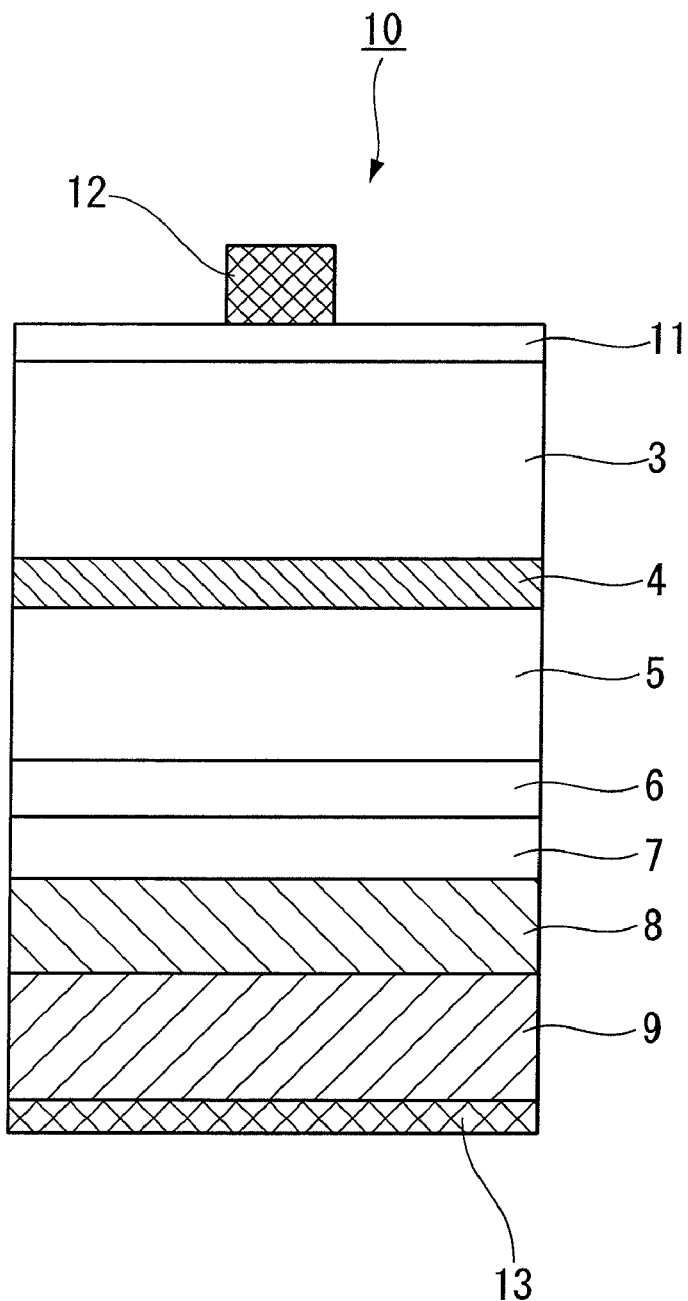
FIG. 1 is a view showing a cross-sectional structure of the nitride semiconductor light emitting device of the present invention.

FIG. 1 is a view showing a cross-sectional structure of the nitride semiconductor light emitting device of the present invention.

The nitride semiconductor light emitting device 10 of the present invention comprises a plate layer 9. A plate adhesion layer 8, a reflective layer 7 which is a Ag film having a thickness of 30 nm, an ohmic contact layer 6 which is a Pt film having a thickness of 1.5 nm, a p-type nitride semiconductor layer 5 which functions as a contacting layer and is a Mg-doped p-type GaN layer having a thickness of 150 nm, a nitride semiconductor light emitting layer 4, and an n-type nitride semiconductor layer 3 which functions as a contacting layer and is a Si-doped n-type GaN layer having a thickness of 5 μm, are laminated on a surface of the plate layer 9 in this order. On the n-type nitride semiconductor layer 3, a negative electrode 12 is formed via a transparent electrode 11. On another surface of the plate layer 9, a positive electrode 13 is formed.

The nitride semiconductor light emitting layer 4 comprises an n-type $In_{0.1}Ga_{0.9}N$ clad layer having a thickness of 30 nm; a multi-well structure which is obtained by laminating a Si doped GaN barrier layer and an $In_{0.2}Ga_{0.8}N$ well layer having a thickness of 2.5 nm five times, and further laminating the Si doped GaN barrier layer on the $In_{0.2}Ga_{0.8}N$ well layer; and a Mg doped p-type $Al_{0.07}Ga_{0.93}N$ clad layer in this order.

The ohmic contact layer 6 made of Pt and the reflective layer 7 made of Ag are both formed by a sputtering method. Patterns for Pt and Ag are formed by a conventional photolithograpy and liftoff technique.

Figure 2:
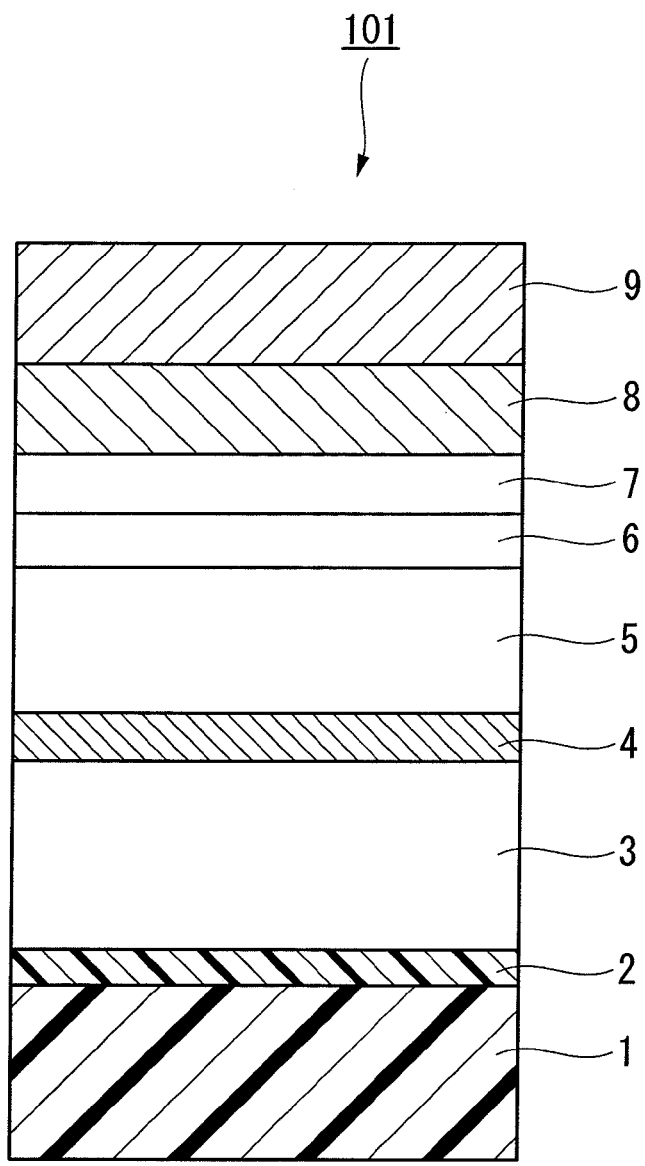
FIG. 2 is a view showing a cross-section of a laminate comprising a substrate and a plate layer used for forming the nitride semiconductor light emitting device of the present invention.

FIG. 2 is a view showing a cross-section of a laminate comprising a substrate and a plate layer used for forming the nitride semiconductor light emitting device 10 of the present invention. The laminate comprising a substrate and a plate layer comprises the substrate 1 made of sapphire, the n-type nitride semiconductor layer 3, the nitride semiconductor light emitting layer 4, the p-type nitride semiconductor layer 5, the ohmic contact layer 6, the reflective layer 7, the plate adhesion layer 8, and the plate layer 9 are formed on the substrate 1 via the buffer layer 2. After producing the laminate comprising a substrate and a plate layer having such a structure, the substrate 1 and the buffer layer 2 are removed by polishing to produce a laminate comprising a plate layer 102 shown in FIG. 3. Then, the nitride semiconductor light emitting device 10 having a structure shown in FIG. 1 is produced by forming electrodes on both surfaces of the laminate comprising a plate layer 102.

Examples of material for the substrate 1 used to produce the laminate 101 comprising a substrate and a plate layer include oxide single crystals such as sapphire single crystal ($Al_2O_3$; A plane, C plane, M plane, and R plane), spinel single crystal ($MgAl_2O_4$), ZnO single crystal, $LiAlO_2$ single crystal, $LiGaO_2$ single crystal, and MgO single crystal; and conventional substrate material such as Si single crystal, SiC single crystal, and GaAs single crystal. These materials can be used for the substrate 1 without any limitation. When a conductive substrate such as a substrate made of SiC is used as the substrate 1, it is not necessary to remove the substrate when producing a light emitting device comprising positive and negative electrodes on both surfaces thereof. However, since a buffer layer which is insulating cannot be used and crystals of the nitride semiconductor layer grown on the buffer layer are degraded, a light emitting device having excellent properties cannot be produced. Therefore, in the present invention it is necessary to remove the substrate even when conductive SiC or Si is used for the substrate 1.

The buffer layer 2 is formed to mitigate the effects of stress due to mismatch of the lattice constants of the substrate 1 and the n-type nitride semiconductor layer 3. For example, when a crystal layer made of GaN is formed on a substrate 1 made of sapphire single crystal, the lattice constant of sapphire single crystal and the lattice constant of GaN differ by 10% or more. In order to improve the crystallinity of GaN, materials having a lattice constant between the lattice constants of sapphire single crystal and GaN, such as AlN and AlGaN are used for the buffer layer 2. In the present invention, AlN and AlGaN are, of course, used as the buffer layer 2 without any limitation.

On the buffer layer 2, a semiconductor light emitting structure is formed. The laminate 101 comprising a substrate and a plate layer shown in FIG. 2 comprises a nitride semiconductor, and specifically, the n-type nitride semiconductor layer 3, the nitride semiconductor light emitting layer 4, and the p-type nitride semiconductor layer 5. Any conventional light emitting structure such as a double hetero-structure (DH), quantum well structure, or multi quantum well structure can be used in the present invention.

As a nitride semiconductor, many semiconductors denoted by the general formula: $Al_xIn_yGa_{1-x-y}N$ ($0 \leq x<1$, $0 \leq y<1$, and $x+y<1$) are known. In the present invention, nitride semiconductors denoted by the general formula can be used without any limitation.

Production methods for these nitride semiconductors are not limited. The present invention can use all methods which are known as methods for growing Group-III nitride semiconductors such as the metalorganic chemical vapor deposition method (MOCVD), hydride vapor phase epitaxy (HVPE), or molecular beam epitaxy method (MBE). Among these, from the point of view of controllability of the thickness of a film, and mass productivity, MOCVD is preferable.

When MOCVD is used to produce the nitride semiconductor, it is preferable that hydrogen ($H_2$) or nitrogen ($N_2$) be used as a carrier gas; that trimethylgallium (TMG) or triethylgallium (TEG) be used as a Ga source which is a group-III source material; that trimethylaluminum (TMA) or triethylaluminum (TEA) be used as an Al source; that trimethylindium (TMI) or triethylindium (TEI) be used as an In source; and that ammonia ($NH_3$) or hydrazine ($N_2H_4$) be used as a N source which is a group-V source material. As an n-type dopant, for example, monosilane ($SiH_4$) or disilane ($Si_2H_6$) is preferably used as a Si source, and germane ($GeH_4$) is preferably used as a Ge source. As a p-type dopant, for example, biscyclopentadienyl magnesium ($Cp_2Mg$) or bisethylcyclopentadienyl magnesium (($EtCp)_2Mg$) is used as a Mg source.

The ohmic contact layer 6 is used for ohmic contact between the p-type nitride semiconductor layer 5 and the reflective layer 7, and is required to have a small contact resistance to the p-type nitride semiconductor layer 5. With respect to the contact resistance to the p-type nitride semiconductor layer 5, elements of the platinum group such as Pt, Ru, Os, Rh, Ir, or Pd or Ag, or alloys thereof is preferable as material for the ohmic contact layer 6. Among these, Pt, Ir, Rh, and Ru are more preferable, and Pt is most preferable. When Ag is used for the ohmic contact layer 6, excellent reflectivity is obtained. However, there is a problem that the contact resistance of Ag is higher than that of Pt. Therefore, Pt is the most preferable material for the ohmic contact layer 6. However, Ag can be used in devices in which a low contact resistance is not required.

To stably obtain a low contact resistance, the thickness of the ohmic contact layer 6 is preferably 0.1 nm or greater, and more preferably 1 nm or greater. In particular, when the thickness of the ohmic contact layer 6 is 1 nm or greater, a uniform contact resistance can be obtained.

The reflective layer 7 made of Ag, Al, or an alloy thereof may be formed on the ohmic contact layer 6. Ag and Al have a higher reflectivity than Pt, Ir, Rh, Ru, Os, and Pd in the visible to ultraviolet wavelengths. That is, since light from the nitride semiconductor light emitting layer 4 is sufficiently reflected, a high-powered device can be produced using the reflective layer made of Ag, Al, or an alloy thereof. In addition, when the reflective layer 7 is made of Ag, Al, or an alloy thereof and the ohmic contact layer 6 is made thin enough for light to pass through, sufficient reflected light can be obtained in addition to obtaining an excellent ohmic contact. Therefore, a high-power device can be produced. The thickness of the ohmic contact layer 6 is preferably 30 nm or less, and more preferably 10 nm or less. When the ohmic contact layer 6 has a thickness in the preferable range, sufficient light passes through the ohmic contact layer 6.

The production method for the ohmic contact layer 6 and the reflective layer 7 is not limited, and examples of the production method thereof include conventional sputtering and deposition methods.

The plate layer 9 is formed on the ohmic contact layer 6 via the plate adhesion layer 8.

The plate adhesion layer 8 is made of an alloy comprising 50% by mass or greater of the same component as the main metallic component of an alloy contained in the plate layer 9. For example, when the plate layer 9 is made by electroless NiP plating, since the main component of the plate layer 9 is Ni, the plate adhesion layer 8 is made of a metal comprising 50% by mass of Ni as a main component. In addition, the plate adhesion layer 8 preferably comprises P which is a secondary component of NiP. That is, the plate adhesion layer 8 is more preferably made of the same alloy as that contained in the plate layer 9. The proportion of components contained in the alloy is not very important. In order to produce a device having excellent properties, it is effective to form the plate adhesion layer 8 before forming the plate layer 9 by using the same alloy that composes in the plate layer 9 so as to contact closely.

In order to obtain excellent adhesion, the thickness of the plate adhesion layer 8 is preferably 0.1 nm or greater, and more preferably 1 nm or greater. When the thickness of the plate adhesion layer 8 is adjusted to 0.1 nm or greater, uniform adhesion can be obtained. Although there is no upper limit to the thickness of the plate adhesion layer 8, it is preferably 2 nm or less from the point of view of productivity, The production method for the plate adhesion layer 8 is not specifically limited, and examples thereof include a conventional sputtering method and deposition method. Since sputtered particles having high energy hit the surface of a base to form a film in the sputtering method, it is possible to form a film having high adhesion. Therefore, a sputtering method is preferably used to form the plate adhesion layer 8. After forming the plate adhesion layer 8 having high adhesion as is explained above, the plate layer 9 having a large thickness is formed.

Since the plate layer 9 is a support base for supporting a main part of the light emitting device 10, it is necessary to have enough thickness and strength to support the main part of the light emitting device 10. That is, the plate layer 9 is a plate substrate for supporting the light emitting structure.

Both electroless plating and electrolysis plating are used for producing the plate layer 9. When electroless plating is used, it is preferable to use a NiP alloy. When electrolysis plating is used, it is preferable to use Cu or a Cu alloy.

In order to maintain sufficient strength for a supporting base, the thickness of the plate layer 9 is preferably 10 μm or greater. If the plate layer 9 is too thick, the plate layer 9 easily peels and producibility decreases; therefore, the thickness is preferably 200 μm or less.

Before plating, it is preferable to degrease and wash the surface of the plate adhesion layer 8 using widely used neutral detergents. In addition, it is also preferable to chemically etch the surface of the plate adhesion layer 8 using acids such as nitric acid to remove a natural oxide film on the plate adhesion layer 8.

When the plate layer 9 is a NiP plating, the plate layer 9 may be formed by electroless plating using a plating bath comprising a source of nickel such as nickel sulfate and nickel chloride, and a phosphorous source such as hypophosphite. Examples of a suitable commercialized product of a plating bath used in electroless plating include NIMUDEN® HDX marketed by Uemura & Co., Ltd. The pH of the plating bath during electroless plating is preferably in a range from 4 to 10, and the temperature thereof is preferably in a range from 30 to 95° C.

When the plate layer 9 is Cu or a Cu alloy plate, the plate layer 9 may be formed by electrolysis plating using a plating bath comprising a source of Cu such as copper sulfate. The plating bath during electrolysis plating is preferably strongly acidic, that is, the pH thereof is preferably 2 or less. The temperature thereof is preferably in a range from 10 to 50° C., and more preferably room temperature (25° C.). The current density is preferably in a range from 0.5 to 10 $A/dm^2$, and more preferably in a range from 2 to 4 $A/dm^2$. In addition, in order to make the surface smooth, a leveling agent is preferably added to the plating bath. Examples of a commercialized product of a leveling agent used include ETN-1-A and ETN-1-B, marketed by Uemura & Co., Ltd.

In order to improve adhesion of the plate layer 9 to the plate adhesion layer 8, it is preferable to heat treat the plate layer 9. The heat treatment temperature is preferably in a range from 100 to 300° C. to improve adhesion. If the heat temperature is more than 300° C., the adhesion may be further improved, but ohmic properties may be degraded.

Figure 3:
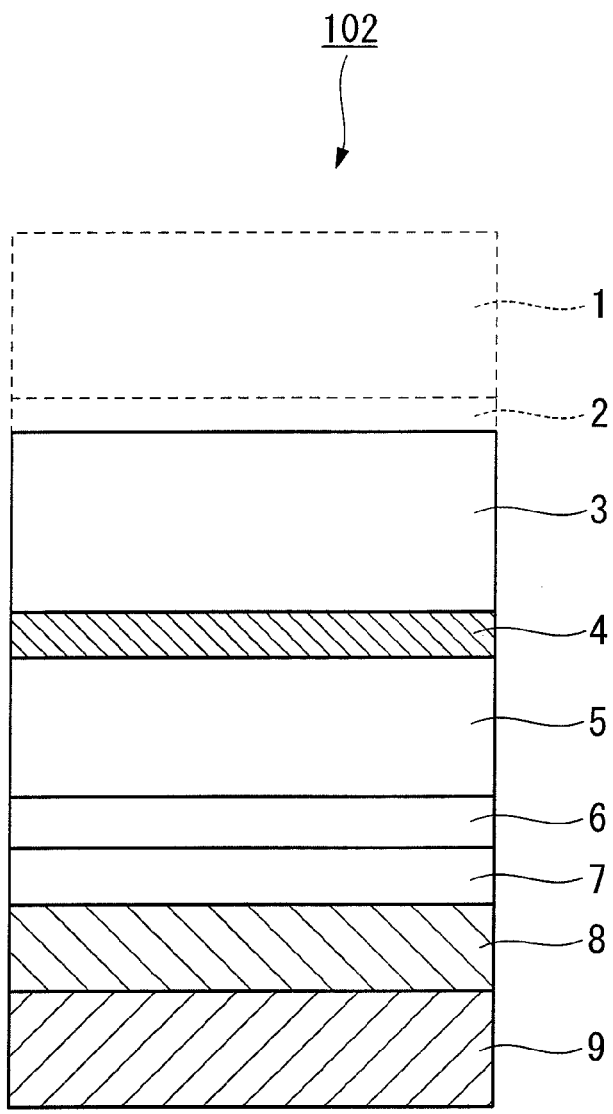
FIG. 3 is a view showing a cross-section of a laminate comprising a plate layer which is obtained by processing the laminate comprising a substrate and a plate layer shown in FIG. 2.
Figure 4:
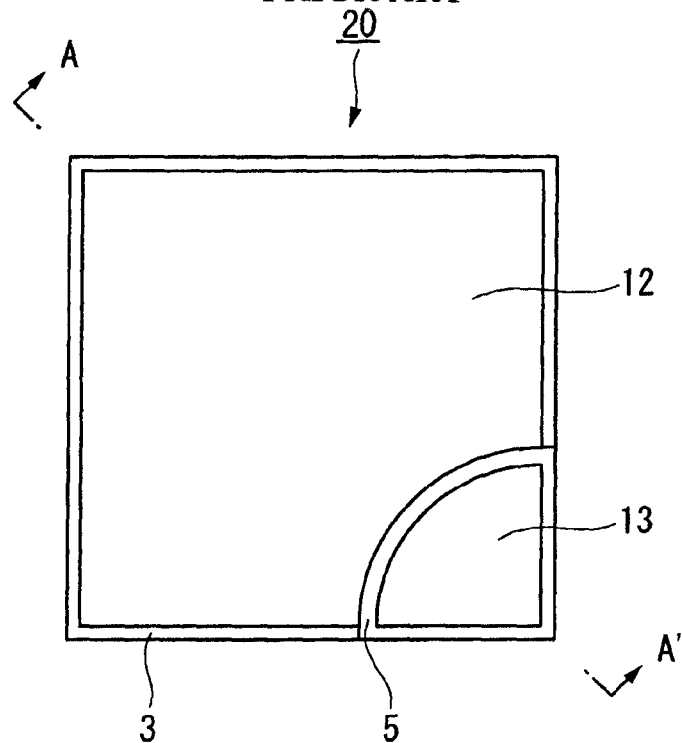
FIG. 4 is a plan view showing one example of a conventional nitride semiconductor light emitting device.
Figure 5:
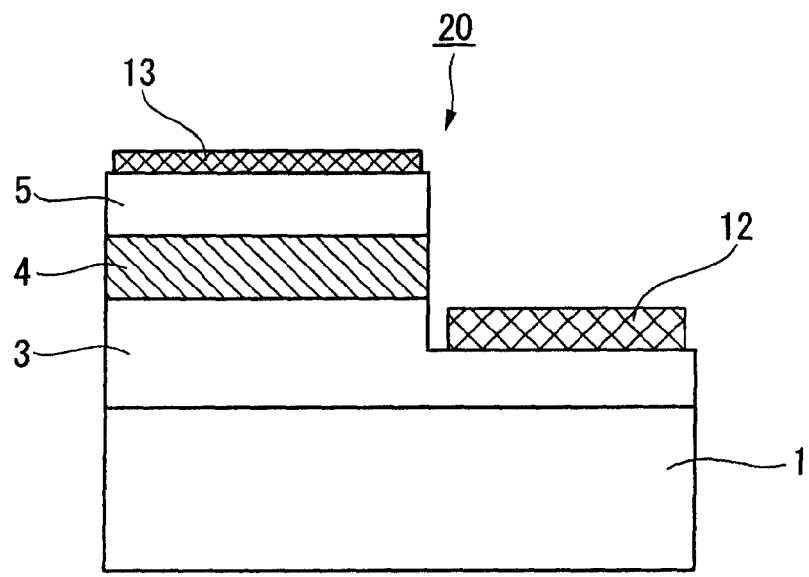
FIG. 5 is a cross-sectional view along the line A-A' of FIG. 4.

After forming the plate layer 9, the sapphire substrate 1 is removed together with the buffer layer 2 to produce the laminate 102 comprising a plate layer shown in FIG. 3. Examples of removing methods for the substrate 1 include any conventional methods such as polishing, etching, or laser-lift off.

After removing the substrate 1, the buffer layer 2 is removed by polishing, etching, or the like, and the n-type nitride semiconductor layer 3 is exposed as is shown in FIG. 3.

After that, the negative electrode 12 is formed on the n-type nitride semiconductor layer 3. As the negative electrode 12, negative electrodes having various compositions and structures are known. In the present invention, conventional negative electrodes can be used without any limitation. For example, in order to apply voltage to the entire surface of the n-type nitride semiconductor layer 3, the transparent electrode 11 such as ITO is formed, and then the negative electrode 12 comprising Cr, Ti, and Au layers is formed, as is shown in FIG. 1.

As the positive electrode 13 formed on the plate layer 9, various positive electrodes comprising Au, Al, Ni, Cu, and the like are known. In the present invention, conventional positive electrodes can be used without any limitation.

In this way, a nitride semiconductor light emitting device, which comprises positive and negative electrodes with high adhesion, which can output high power, and which does not generate heat, is produced.

EXAMPLES

Below, preferred embodiments of the nitride semiconductor light emitting device according to the present invention will be explained with reference to Examples and Comparative Examples.

Example 1

On a sapphire substrate, a buffer layer made of AlN having a thickness of 10 nm, a Si-doped n-type GaN contacting layer having a thickness of 5 μm, and an n-type $In_{0.1}Ga_{0.9}N$ cladding layer having a thickness of 30 μm were laminated in this order. Then, a light emitting layer having a multi-well structure, in which a Si-doped n-type GaN barrier layer having a thickness of 30 nm and an $In_{0.2}Ga_{0.2}Ga_{0.8}N$ well layer having a thickness of 2.5 nm were laminated five times, and then the barrier layer was laminated, was laminated on the cladding layer. After that, a Mg-doped p-type $Al_{0.07}Ga_{0.93}N$ cladding layer having a thickness of 50 nm and a Mg-doped p-type GaN contacting layer having a thickness of 150 nm were laminated successively on the light emitting layer.

Then, a Pt layer having a thickness of 1.5 nm was formed on the p-type contacting layer of the resulting nitride semiconductor by sputtering. After that, a Ag layer having a thickness of 30 nm was formed on the Pt layer by sputtering. The Pt and Ag patterns were formed by conventional photolithography and lift off techniques.

Then, a NiP alloy film (Ni: 80 at %, P: 20 at %) having a thickness of 30 nm was formed by sputtering to produce a plate adhesion layer.

The surface of the NiP alloy film was immersed in a nitric acid solution (5N) at 25° C. for 30 seconds to remove an oxide film formed on the surface of the NiP alloy film.

Then, using a plating bath (NIUMUDEN® HDX-7G marketed by Uemura & Co., Ltd.), an electroless plated layer made of a NiP alloy having a thickness of 50 μm was formed on the NiP alloy film to produce a plate layer (metallic plate substrate). The electroless plating was performed under conditions in which the pH was 4.6, the temperature was 90° C., and the treatment time was 3 hours. After the resulting laminate comprising a substrate and a plate layer was washed with water and dried, it was heated at 250° C. for 1 hour using a clean oven.

After that, the sapphire substrate and the buffer layer were removed by polishing to expose the n-type semiconductor layer.

On the n-type semiconductor layer, an ITO film ($SnO_2$: 10% by mass) having a thickness of 400 nm was formed by deposition. Then, a negative electrode comprising a Cr film having a thickness of 40 nm, a Ti film having a thickness of 100 nm, and a Au film having a thickness of 1,000 nm was formed on the center of the surface of the ITO by deposition. The pattern of the negative electrode was formed by conventional photolithography and lift off technologies.

On the surface of the p-type semiconductor layer, a positive electrode comprising a Au film having a thickness of 1,000 nm was formed by deposition.

Then, the resulting laminate was divided into the nitride semiconductor light emitting device shown in FIG. 1 having a specific size by dicing.

In order to evaluate the adhesion, after making and heating the laminate comprising a substrate and a plate layer, a peeling test was performed. As the peeling test, an accelerated test combining the method specified in JIS H8602-1992 and a heat shock method was used. That is, linear scratches were made in the ohmic contact layer and the plate layer using a cutter knife such that grids having an interval of 1 mm were produced. The depth of the scratches was adjusted to the distance to the surface of the sapphire substrate. Next, after heating in an oven at 200° C. for 30 minutes, the laminate was rapidly cooled to 20° C. in water and then dried. After that, an adhesive tape (adhesive cellophane tape, width: 12 mm, marketed by Nichiban Co., Ltd.) was adhered closely to the surface of the plate layer where the linear scratches were made, then the adhesive tape was peeled from the surface of the plate layer. Then, the number of remaining partitions which were not peeled out of 100 partitions having a size of 1 mm×1 mm formed by the linear scratches, was counted. That is, when 100 partitions remain, it is evaluated as "no peeling". The results are shown in Table 1.

Examples 2 and 3 and Comparative Examples 1 to 3

A nitride semiconductor light emitting device was prepared and evaluated in a manner identical to that of Example 1, except that the composition and the thickness of the plate adhesion layer and the plate layer were changed. The evaluation results are shown in Table 1.

Example 4

A nitride semiconductor light emitting device was prepared and evaluated in a manner identical to that of Example 1, except that a Cu film having a thickness of 30 nm was formed by a sputtering method as a plate adhesion layer instead of the NiP alloy film, and a Cu film having a thickness of 50 μm was formed in an electrolysis plating method as a plate layer instead of the NiP alloy film. The evaluation results are shown in Table 1.

Moreover, Cu was electrolysis plated to produce the plate layer under conditions in which a plating bath comprising 80 g/L of $CuSO_4$, 200 g/L of sulfuric acid, and a leveling agent (marketed by Uemura & Co., Ltd., 1.0 mL/L of ETN-1-A, and 1.0 mL/L of ETN-1-B) was used, current density was 2.5 A/$cm^2$, the plating time was 3 hours, and material containing copper phosphate was used as an anode.

Comparative Examples 4 to 6

A comparative nitride semiconductor light emitting device was prepared and evaluated in a manner identical to that of Example 4, except that the plate adhesion layer having the composition and the thickness shown in Table 1 was made instead of the plate adhesion layer made of Cu. The evaluation results are shown in Table 1.

TABLE 1

| | Plate adhesion layer | | Plate layer | | Remaining partitions in peeling test |
|---|---|---|---|---|---|
| | Composition (% by mass) | Thickness (nm) | Composition (% by mass) | Thickness (nm) | |
| Example 1 | 80Ni—20P | 30 | 80Ni—20P | 50 | 100 |
| Example 2 | 80Ni—20P | 5 | 80Ni—20P | 50 | 100 |
| Example 3 | 80Ni—20P | 100 | 80Ni—20P | 50 | 100 |
| Example 4 | Cu | 30 | Cu | 50 | 100 |
| Comparative Example 1 | No plate adhesion layer | | 80Ni—20P | 50 | 45 |
| Comparative Example 2 | Au | 30 | 80Ni—20P | 50 | 58 |
| Comparative Example 3 | 80Au—20Ge | 30 | 80Ni—20P | 50 | 57 |
| Comparative Example 4 | No plate adhesion layer | | Cu | 50 | 37 |
| Comparative Example 5 | Au | 30 | Cu | 50 | 49 |
| Comparative Example 6 | 80Au—20Ge | 30 | Cu | 50 | 54 |

It is clear from Table 1 that the nitride semiconductor light emitting device of Examples 1 to 3, in which the plate layer was made of NiP by electroless plating, and the plate adhesion layer was also made of NiP, which is the same material as that of the plate layer, has superior adhesion between the plate adhesion layer and the plate layer. In contrast, it is also clear from Table 1 that the nitride semiconductor light emitting device having no plate adhesion layer in Comparative Example 1, and the nitride semiconductor light emitting device comprising the plate adhesion layer made of Au which does not contain NiP in Comparative Example 2, and the nitride semiconductor light emitting device comprising the plate adhesion layer made of a AuGe alloy which does not contain NiP in Comparative Example 3 were inferior with regard to the adhesion.

In addition, it is clear from Table 1 that the nitride semiconductor light emitting device of Example 4, in which the plate layer was made of Cu by electrolysis plating, and the plate adhesion layer was also made of Cu, has superior adhesion between the plate adhesion layer and the plate layer. In contrast, it is also clear from Table 1 that the nitride semiconductor light emitting device having no plate adhesion layer in Comparative Example 4, the nitride semiconductor light emitting device comprising the plate adhesion layer made of Au which does not contain Cu in Comparative Example 5, and the nitride semiconductor light emitting device comprising the plate adhesion layer made of AuGe which does not contain Cu in Comparative Example 6 were inferior with regard to the adhesion.

INDUSTRIAL APPLICABILITY

The nitride semiconductor light emitting device of the present invention is a nitride semiconductor light emitting device which has higher adhesion and does not peel and which is created by forming a plate adhesion layer between the ohmic contact layer and the plate layer, and forming the plate adhesion layer of an alloy contained in 50% by mass or greater of a same component as a main component of an alloy comprising the plate layer. As a result, the present invention provides a light emitting device comprising a positive electrode and a negative electrode on upper surface and lower surface thereof having high quality and stability.

In addition, the plate layer, one of the component of the nitride semiconductor light emitting device of the present invention has enough thickness and strength to support the main component of the device. Therefore, it is possible that the plate layer stably support the device during the production process.

The invention claimed is:

1. A nitride semiconductor light emitting device comprising at least an ohmic contact layer, a p-type nitride semiconductor layer, a nitride semiconductor light emitting layer, and an n-type nitride semiconductor layer, which are laminated on a plate layer,
    wherein a plate adhesion layer is formed between the ohmic contact layer and the plate layer, and
    the plate adhesion layer is made of an alloy comprising 50% by mass or greater of a same component as a main component of an alloy contained in the plate layer.

2. The nitride semiconductor light emitting device according to claim 1, wherein a thickness of the plate layer is in a range from 10 μm to 200 μm.

3. The nitride semiconductor light emitting device according to claim 1, wherein the plate layer is made of a NiP alloy.

4. The nitride semiconductor light emitting device according to claim 1, wherein the plate layer is made of Cu or a Cu alloy.

5. The nitride semiconductor light emitting device according to claim 3, wherein the plate adhesion layer is made of a NiP alloy.

6. The nitride semiconductor light emitting device according to claim 4, wherein the plate adhesion layer is made of Cu or a Cu alloy.

7. The nitride semiconductor light emitting device according to claim 1, wherein a thickness of the plate adhesion layer is in a range from 0.1 nm to 2 μm.

8. The nitride semiconductor light emitting device according to claim 1, wherein the ohmic contact layer is made of at least one selected from the group consisting of Pt, Ru, Os, Rh, Ir, Pd, Ag, and alloys thereof.

9. The nitride semiconductor light emitting device according to claim 1, wherein a thickness of the ohmic contact layer is in a range from 0.1 nm to 30 nm.

10. The nitride semiconductor light emitting device according to claim 1, wherein a reflective layer is made of Ag, Al or an alloy thereof is formed on the ohmic contact layer.

11. A method for producing a nitride semiconductor light emitting device, said nitride semiconductor light emitting device comprising:
    at least an ohmic contact layer, a p-type nitride semiconductor layer, a nitride semiconductor light emitting layer, and an n-type nitride semiconductor layer, which are laminated on a plate layer, wherein a plate adhesion layer is formed between the ohmic contact layer and the plate layer, and the plate adhesion layer is made of an alloy comprising 50% by mass or greater of a same component as a main component of an alloy contained in the plate layer, said method comprising:
    laminating at least a buffer layer, an n-type nitride semiconductor layer, a nitride semiconductor light emitting layer, a p-type nitride semiconductor layer, an ohmic contact layer, a plate adhesion layer, and a plate layer on a substrate made of an oxide single crystal or a semiconductor single crystal in this order; after that, removing the substrate and the buffer layer; and then forming electrodes.

12. The method for producing a nitride semiconductor light emitting device according to claim 11, wherein the plate adhesion layer is formed by a sputtering method.

13. The method for producing a nitride semiconductor light emitting device according to claim 11, wherein the plate layer is formed by an electrolysis plating method.

14. The method for producing a nitride semiconductor light emitting device according to claim 11, wherein the plate layer is formed by an electrolysis plating method.

15. The method for producing a nitride semiconductor light emitting device according to claim 11, wherein after forming the plate layer, the obtained product is heated at a temperature in a range from 100° C. to 300° C.

* * * * *